United States Patent
Kim et al.

(10) Patent No.: US 12,388,000 B2
(45) Date of Patent: Aug. 12, 2025

(54) SEMICONDUCTOR PACKAGE INCLUDING REDISTRIBUTION PATTERN

(71) Applicant: Samsung Electronics Co., Ltd., Suwon-si (KR)

(72) Inventors: Dahee Kim, Cheonan-si (KR); Gookmi Song, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 594 days.

(21) Appl. No.: 17/695,110

(22) Filed: Mar. 15, 2022

(65) Prior Publication Data

US 2022/0406697 A1 Dec. 22, 2022

(30) Foreign Application Priority Data

Jun. 17, 2021 (KR) ........................ 10-2021-0078640

(51) Int. Cl.
  *H01L 23/498* (2006.01)
  *H01L 23/00* (2006.01)
  (Continued)

(52) U.S. Cl.
  CPC .... *H01L 23/49822* (2013.01); *H01L 23/3128* (2013.01); *H01L 24/08* (2013.01);
  (Continued)

(58) Field of Classification Search
  CPC .......... H01L 23/49822; H01L 23/3128; H01L 24/08; H01L 25/105; H01L 2224/08235; H01L 2225/1058
  See application file for complete search history.

(56) References Cited

U.S. PATENT DOCUMENTS

| 8,569,630 B2 | 10/2013 | Naganuma et al. |
| 10,163,832 B1 | 12/2018 | Huang et al. |

(Continued)

FOREIGN PATENT DOCUMENTS

| KR | 100467825 B1 | 1/2005 |
| KR | 10-2017-0054875 A | 5/2017 |

OTHER PUBLICATIONS

Korean Office Action dated May 26, 2025 issued in Korean Patent Application No. 10-2021-0078640.

*Primary Examiner* — Andres Munoz
*Assistant Examiner* — Neil R Prasad
(74) *Attorney, Agent, or Firm* — Harness, Dickey & Pierce, P.L.C.

(57) ABSTRACT

A semiconductor package includes a semiconductor chip including a connecting pad, a mold layer covering the semiconductor chip, a lower redistribution layer on the semiconductor chip and the mold layer, and a connecting terminal on the lower redistribution layer. The lower redistribution layer includes a first lower insulating layer, a first conformal redistribution pattern extending through the first lower insulating layer, a second lower insulating layer on the first lower insulating layer and the first conformal redistribution pattern, and a first filled redistribution pattern disposed on the first conformal redistribution pattern and extending through the second lower insulating layer. A side surface of the first filled redistribution pattern is spaced apart from an inner side surface of the first conformal redistribution pattern. The second lower insulating layer is between the inner side surface of the first conformal redistribution pattern and the side surface of the first filled redistribution pattern.

20 Claims, 11 Drawing Sheets

(51) Int. Cl.
*H01L 23/31* (2006.01)
*H01L 25/10* (2006.01)

(52) U.S. Cl.
CPC .. *H01L 25/105* (2013.01); *H01L 2224/08235* (2013.01); *H01L 2225/1058* (2013.01)

(56) References Cited

U.S. PATENT DOCUMENTS

| | | |
|---|---|---|
| 10,446,481 B2 | 10/2019 | Kim et al. |
| 10,763,206 B2 | 9/2020 | Wang et al. |
| 10,872,864 B2 | 12/2020 | Wang et al. |
| 2010/0062600 A1 | 3/2010 | Utsuki |
| 2017/0032977 A1 | 2/2017 | Chen et al. |
| 2017/0062353 A1* | 3/2017 | Tang ................ H01L 23/49811 |
| 2017/0133309 A1 | 5/2017 | Kim et al. |
| 2018/0308779 A1* | 10/2018 | Tsao ........................ H01L 24/02 |
| 2018/0342452 A1* | 11/2018 | Kim ................ H01L 23/49811 |
| 2019/0006283 A1* | 1/2019 | Wang ................ H01L 23/5386 |
| 2020/0194362 A1* | 6/2020 | Park ................ H01L 23/5383 |
| 2021/0020608 A1* | 1/2021 | Kim ...................... H01L 23/544 |

* cited by examiner

SEMICONDUCTOR PACKAGE INCLUDING REDISTRIBUTION PATTERN

CROSS-REFERENCE TO THE RELATED APPLICATION

This application claims priority from Korean Patent Application No. 10-2021-0078640, filed on Jun. 17, 2021, in the Korean Intellectual Property Office, the disclosure of which is incorporated herein by reference in its entirety.

BACKGROUND

1. Field

The example embodiments of the disclosure relate to semiconductor packages including a redistribution pattern.

2. Description of the Related Art

In accordance with advances in electronics industries, development of a variety of technologies for achieving an enhancement in reliability and miniaturization of a semiconductor package is required. In order to meet such a requirement of an enhancement in reliability and miniaturization of a semiconductor package, active research on technology using a redistribution line is being conducted.

SUMMARY

The example embodiments of the disclosure provide semiconductor packages capable of eliminating a problem caused by a coefficient of thermal expansion difference between a semiconductor chip and a redistribution pattern in a semiconductor package using a redistribution line.

A semiconductor package according to an example embodiment of the disclosure may include a semiconductor chip including a connecting pad, a mold layer covering the semiconductor chip, a lower redistribution layer on the semiconductor chip and the mold layer, and a connecting terminal on the lower redistribution layer. The lower redistribution layer may include a first lower insulating layer, a first conformal redistribution pattern extending through the first lower insulating layer, a second lower insulating layer on the first lower insulating layer and the first conformal redistribution pattern, and a first filled redistribution pattern on the first conformal redistribution pattern, the first filled redistribution pattern extending through the second lower insulating layer. A side surface of the first filled redistribution pattern may be spaced apart from an inner side surface of the first conformal redistribution pattern. The second lower insulating layer may be between the inner side surface of the first conformal redistribution pattern and the side surface of the first filled redistribution pattern.

A semiconductor package according to an example embodiment of the disclosure may include a base layer including an opening, a conductive connector extending through the base layer, a semiconductor chip in the opening, a mold layer covering a top surface of each of the base layer and the semiconductor chip, and a lower redistribution layer on the base layer, the semiconductor chip and the mold layer. The semiconductor chip may include a die, a chip pad on the die, and a connecting pad on the chip pad. The connecting pad may include a first top surface, a second top surface, and an inner side surface interconnecting the first top surface and the second top surface. The lower redistribution layer may include a first lower insulating layer on the semiconductor chip, a first lower redistribution pattern extending through the first lower insulating layer, the first lower redistribution pattern including a first via contacting the first top surface of the connecting pad, and a first conductive pad on the first via, and a second lower redistribution pattern on the first lower redistribution pattern. A side surface of the first via may be spaced apart from the inner side surface of the connecting pad. The first lower insulating layer may be between the side surface of the first via and the inner side surface of the connecting pad.

A semiconductor package according to an example embodiment of the disclosure may include a semiconductor chip including a chip pad, a mold layer covering the semiconductor chip, a lower redistribution layer on a bottom surface of the mold layer, and a conductive connector connected to the lower redistribution layer and extending through the mold layer. The lower redistribution layer may include an under bump metal (UBM), a first lower insulating layer covering the UBM, a first conformal redistribution pattern on the UBM, the first conformal redistribution pattern extending through the first lower insulating layer, a second lower insulating layer on the first conformal redistribution pattern, and a first filled redistribution pattern on the first conformal redistribution pattern, the first filled redistribution pattern extending through the second lower insulating layer. A side surface of the first filled redistribution pattern may be spaced apart from an inner side surface of the first conformal redistribution pattern. The second lower insulating layer may be between the inner side surface of the first conformal redistribution pattern and the side surface of the first filled redistribution pattern.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
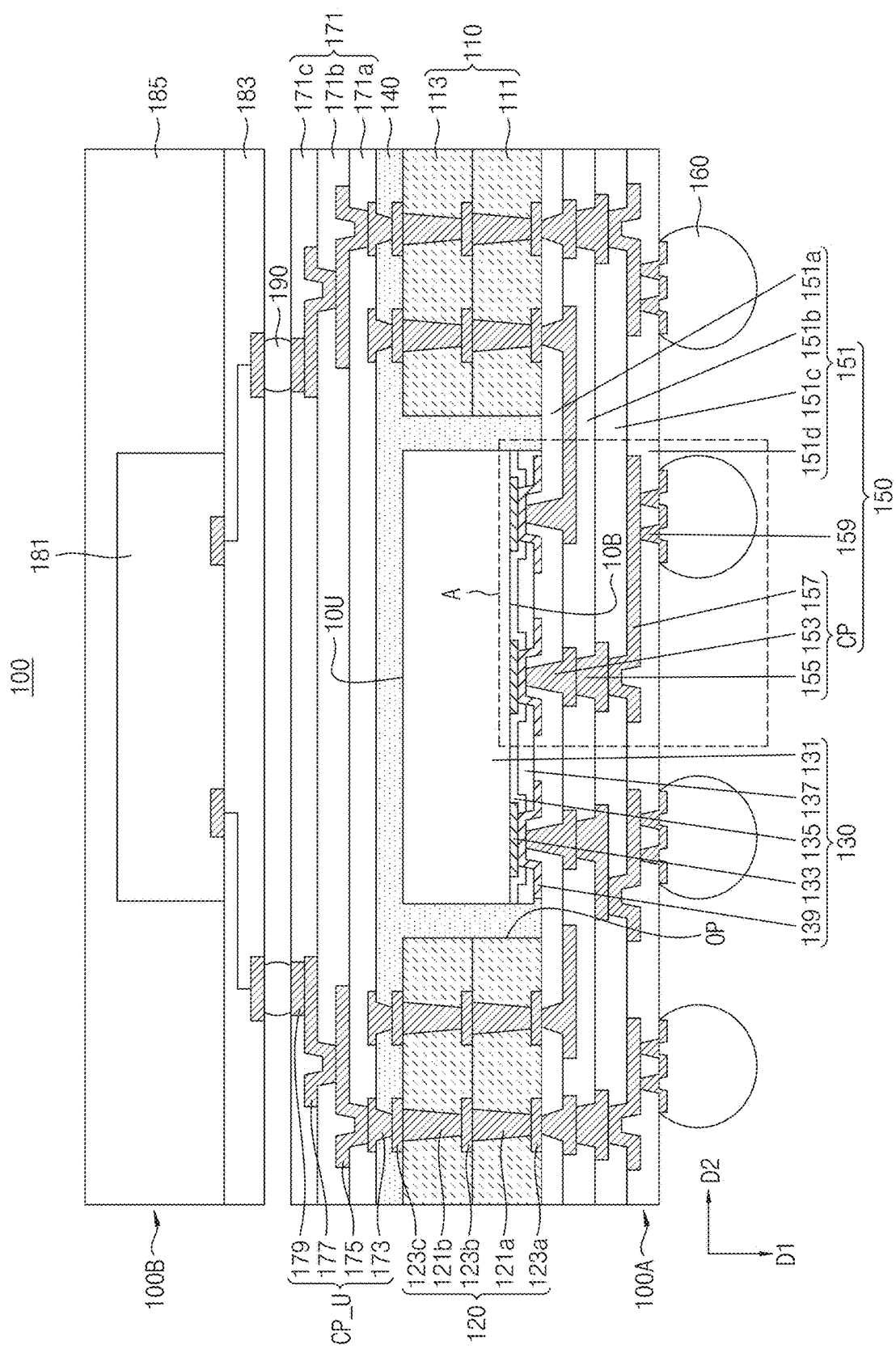
FIG. 1 is a sectional view of a semiconductor package according to an example embodiment of the disclosure.

FIG. 1 is a sectional view of a semiconductor package according to an example embodiment of the disclosure.

Referring to FIG. 1, a semiconductor package 100 may include a lower semiconductor package 100A, and an upper semiconductor package 100B on the lower semiconductor package 100A. The upper semiconductor package 100B may be disposed on the lower semiconductor package 100A via connecting terminals 190.

The lower semiconductor package 100A may include a base layer 110, a conductive connector 120, a semiconductor chip 130, a mold layer 140, a lower redistribution layer 150, connecting terminals 160, and an upper redistribution layer 171/CP_U.

The base layer 110 may be disposed outside the semiconductor chip 130. The base layer 110 may have, at a central portion thereof, an opening OP extending through the base layer 110 in a first direction D1, and may be a plate having a quadrangular rim shape when viewed in a top view. The semiconductor chip 130 may be disposed in the opening OP. When viewed in a top view, the base layer 110 may surround a side surface of the semiconductor chip 130. The size of the opening OP may be greater than the size of the semiconductor chip 130. The semiconductor chip 130 and the base layer 110 may be spaced apart from each other in a second direction D2. The second direction D2 may perpendicularly intersect the first direction D1.

The base layer 110 may have a multilayer structure. For example, the base layer 110 may include a first base layer 111 and a second base layer 113. The first base layer 111 and the second base layer 113 may be sequentially stacked on a top surface of the lower redistribution layer 150 in a direction opposite to the first direction D1. The first base layer 111 may be disposed on the lower redistribution layer 150, and the second base layer 113 may be disposed on the first base layer 111. For example, the base layer 110 may include at least one of phenol resin, epoxy resin, and polyimide. For example, the base layer 110 may include at least one of flame retardant 4 (FR4), tetrafunctional epoxy, polyphenylene ether, bismaleimide triazine (BT), epoxy/polyphenylene oxide, Thermount, cyanate ester, polyimide, and liquid crystal polymer.

At least some of the conductive connector 120 may extend through the base layer 110, and thus may electrically interconnect the lower redistribution layer 150 and the upper redistribution layer 171/CP_U. The conductive connector 120 may include conductive vias 121a and 121b, and conductive pads 123a, 123b and 123c. The conductive vias 121a and 121b may include a first conductive via 121a and a second conductive via 121b. The conductive pads 123a, 123b and 123c may include a first conductive pad 123a, a second conductive pad 123b, and a third conductive pad 123c. The first conductive pad 123a may be disposed on a bottom surface of the first base layer 111, the second conductive pad 123b may be disposed on a top surface of the first base layer 111, and the first conductive via 121a may extend through the first base layer 111, and thus may interconnect the first conductive pad 123a and the second conductive pad 123b. The third conductive pad 123c may be disposed on a top surface of the second base layer 113, the second conductive via 121b may extend through the second base layer 113, and thus may interconnect the second conductive pad 123b and the third conductive pad 123c.

The semiconductor chip 130 may be disposed in the opening OP of the base layer 110. The semiconductor chip 130 may include a die 131, chip pads 133, a first passivation layer 135, a second passivation layer 137, and connecting pads 139. The die 131 may include at least one of silicon, germanium, and gallium arsenide. Various circuits may be formed at the die 131. The chip pads 133 may be disposed on a bottom surface 10B of the die 131. The chip pads 133 may include a conductive material. The first passivation layer 135 may cover a portion of the bottom surface 10B of the die 131, a portion of a bottom surface of each chip pad 133 and a side surface of each chip pad 133. The first passivation layer 135 may expose a portion of the bottom surface of each chip pad 133. For example, the first passivation layer 135 may include silicon oxide and/or silicon nitride. The second passivation layer 137 may cover the first passivation layer 135. The first passivation layer 135 may be disposed between the second passivation layer 137 and the die 131 and between the second passivation layer 137 and the chip pads 133. The second passivation layer 137 may expose the chip pads 133 through the first passivation layer 135 exposing the chip pads 133. A plurality of openings OP1 (cf. FIG. 2) respectively exposing the chip pads 133 may be formed at the first passivation layer 135 and the second passivation layer 137. For example, the second passivation layer 137 may include photosensitive polyimide (PSPI). The connecting pads 139 may be connected to the chip pads 133, respectively. The connecting pads 139 may be connected to the chip pads 133 through the openings OP1 (cf. FIG. 2) of the first passivation layer 135 and the second passivation layer 137, respectively. The connecting pads 139 may contact the first passivation layer 135 through the openings OP1 (cf. FIG. 2). The connecting pads 139 may cover a portion of a bottom surface of the second passivation layer 137. The connecting pads 139 may include a conductive material.

The mold layer 140 may be disposed on the semiconductor chip 130 and the base layer 110. The mold layer 140 may fill the opening OP of the base layer 110 while extending between the semiconductor chip 130 and the base layer 110. The mold layer 140 may cover a side surface and a top surface 10U of the semiconductor chip 130, and may cover a top surface and an inner side surface of the base layer 110. For example, the mold layer 140 may include an epoxy molding compound (EMC).

The lower redistribution layer 150 may be disposed on the base layer 110, the semiconductor chip 130 and the mold layer 140. The lower redistribution layer 150 may be disposed on the bottom surface 10B of the die 131 of the semiconductor chip 130. The lower redistribution layer 150 may include lower insulating layers 151, lower redistribution patterns CP, and under bump metals (UBMs) 159. The lower insulating layers 151 may include a first lower insulating layer 151a, a second lower insulating layer 151b, a third lower insulating layer 151c, and a fourth lower insulating layer 151d. The first to fourth lower insulating layers 151a, 151b, 151c and 151d may be sequentially stacked on a bottom surface of the base layer 110 and a bottom surface of the semiconductor chip 130 in the first direction D1. For example, the first to fourth lower insulating layers 151a, 151b, 151c and 151d may include a curable material. That is, the lower insulating layers 151 may be a material cured by heat or light. For example, the curable material included in the first to fourth lower insulating layers 151a, 151b, 151c and 151d may include an inorganic material such as silicon oxide, silicon nitride or a silicon oxynitride and/or a polyamide series polymer material. For example, the curable material included in the lower insulating layers 151 may include at least one of photosensitive polyimide (PSPI), polybenzoxazole (PBO), a phenolic polymer, a benzocyclobutene (BCB) series polymer and an epoxy series polymer.

The lower redistribution patterns CP may be disposed in the lower insulating layers 151. The lower redistribution patterns CP may include a first lower redistribution pattern 153, a second lower redistribution pattern 155, and a third lower redistribution pattern 157. The first to third lower redistribution patterns 153, 155 and 157 may be sequentially stacked in the first direction D1. The first lower redistribution pattern 153 may be directly connected to the connecting pad 139. A portion of the first lower redistribution pattern 153 may extend through the first lower insulating layer 151a, and another portion of the lower redistribution pattern 153 may be disposed on a bottom surface of the first lower insulating layer 151a. The second lower redistribution pattern 155 may be connected to the first lower redistribution pattern 153. A portion of the second lower redistribution pattern 155 may extend through the second lower insulating layer 151b, and another portion of the second lower redistribution pattern 155 may be disposed on a bottom surface of the second lower insulating layer 151b. The third lower redistribution pattern 157 may be connected to the second lower redistribution pattern 155. A portion of the third lower redistribution pattern 157 may extend through the third lower insulating layer 151c, and another portion of the third lower redistribution pattern 157 may be disposed on a bottom surface of the third lower insulating layer 151c. The lower redistribution patterns CP may include a conductive material. For example, the lower redistribution patterns CP may include copper.

The UBMs 159 may be electrically connected to the lower redistribution patterns CP. The UBMs 159 may be directly connected to the third lower redistribution pattern 157. A portion of each UBM 159 may be connected to a bottom surface of the third lower redistribution pattern 157 while extending through the fourth lower insulating layer 151d, and another portion of each UBM 159 may be disposed on a bottom surface of the fourth lower insulating layer 151d. The UBMs 159 may include a conductive material.

The connecting terminals 160 may be disposed on a bottom surface of the lower redistribution layer 150. The connecting terminals 160 may be connected to the UBMs 159, respectively. The connecting terminals 160 may be disposed on bottom surfaces of the UBMs 159, respectively. The connecting terminals 160 may be electrically connected to the semiconductor chip 130 and/or the conductive connector 120 via the UBMs 159 and the lower redistribution patterns CP.

The upper redistribution layer 171/CP_U may be disposed on the mold layer 140. The upper redistribution layer 171/CP_U may be disposed on the top surface 10U of the semiconductor chip 130. The upper redistribution layer 171/CP_U may include upper insulating layers 171 and upper redistribution patterns CP_U. The upper insulating layers 171 may include a first upper insulating layer 171a, a second upper insulating layer 171b, and a third upper insulating layer 171c. The first to third upper insulating layers 171a, 171b and 171c may be sequentially stacked on the mold layer 140 in the direction opposite to the first direction D1. The upper insulating layers 171 may include the same material as the lower insulating layers 151.

The upper redistribution patterns CP_U may be disposed in the upper insulating layers 171. The upper redistribution patterns CP_U may include a first upper redistribution pattern 173, a second upper redistribution pattern 175, a third upper redistribution pattern 177, and an upper pad 179. The first upper redistribution pattern 173 may be connected to the third conductive pad 123c while extending through the mold layer 140. The first upper insulating layer 171a may cover a portion of the first upper redistribution pattern 173. The second upper redistribution pattern 175 may be connected to the first upper redistribution pattern 173 while extending through the first upper insulating layer 171a. The second upper insulating layer 171b may cover a portion of the second upper redistribution pattern 175. The third upper redistribution pattern 177 may be disposed on the second upper redistribution pattern 175. The upper pad 179 may be disposed on the third upper redistribution pattern 177. The third upper insulating layer 171c may cover a portion of the third upper redistribution pattern 177 and a portion of the upper pad 179. The third upper insulating layer 171c may expose a top surface of the upper pad 179. The connecting terminal 190 may be disposed on the upper pad 179.

The upper semiconductor package 100B may include a semiconductor chip 181, a redistribution layer 183, and a mold layer 185. In an example embodiment, the upper semiconductor package 100B may include a configuration identical or similar to the configuration of the lower semiconductor package 100A. For example, the redistribution layer 183 may have the same configuration as the lower redistribution layer 150.

Figure 2:
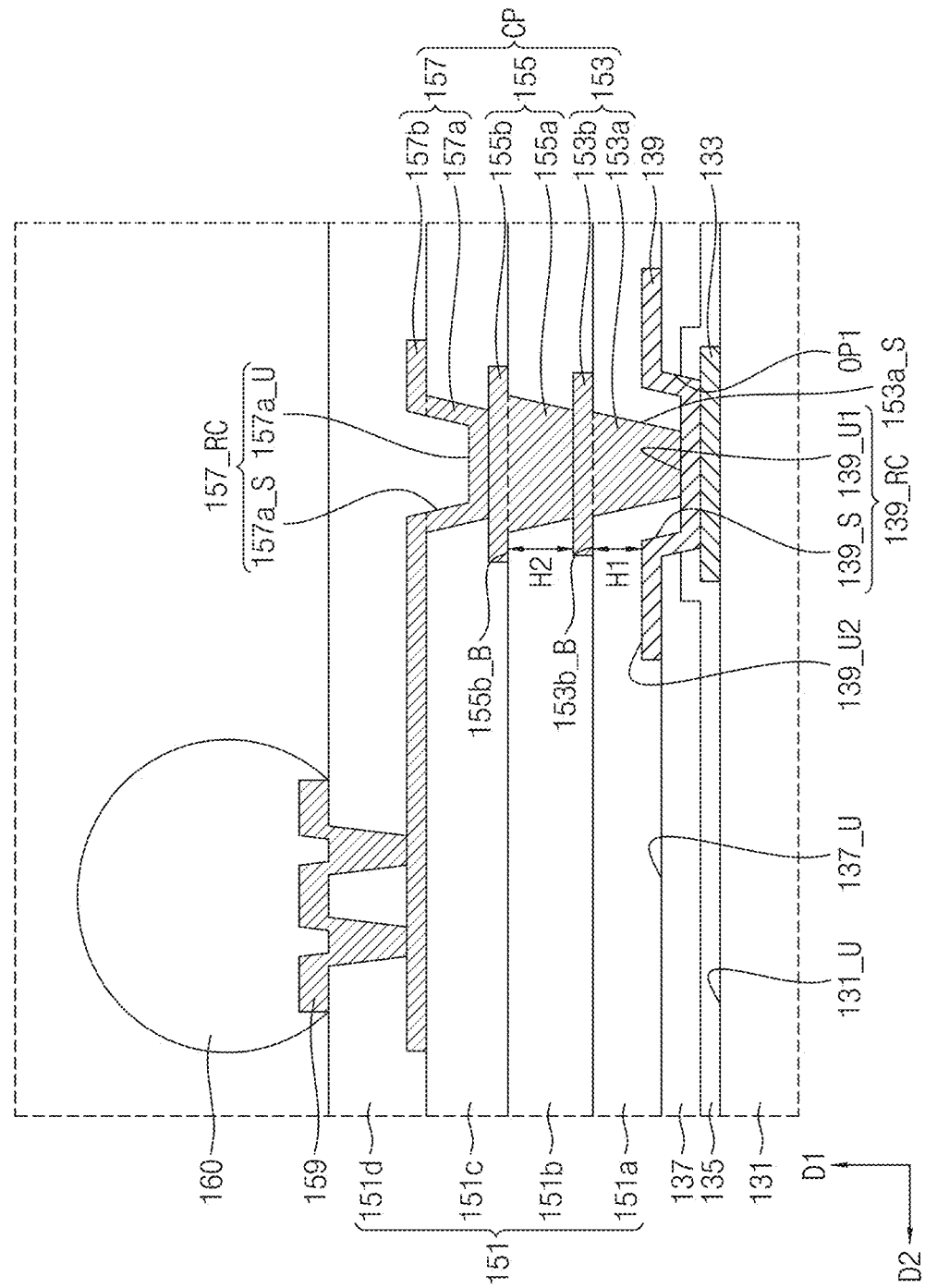
FIG. 2 is an enlarged view of a portion A of FIG. 1.

FIG. 2 is an enlarged view of a portion A of FIG. 1. In FIG. 2, the portion A of FIG. 1 is shown in an inverted state such that the connecting terminal 160 is disposed at a higher level than the lower redistribution layer 150, for convenience of description. Accordingly, a constituent element referred to as a "top surface" in FIG. 1 may be referred to as a "bottom surface" in FIG. 2, and a constituent element referred to as a "bottom surface" in FIG. 1 may be referred to as a "top surface" in FIG. 2.

Referring to FIG. 2, the connecting pad 139 may include a first top surface 139_U1, a second top surface 139_U2, and an inner side surface 139_S. The second top surface 139_U2 may be disposed relatively farther from the die 131 of the semiconductor chip 130 than the first top surface 139_U1. The first top surface 139_U1 may be disposed at a lower level than a top surface 137_U of the second passivation layer 137 of the semiconductor chip 130 with reference to a top surface 131_U of the die 131, and the second top surface 139_U2 may be disposed at a higher level than the top surface 137_U of the second passivation layer 137 of the semiconductor chip 130 with reference to the top surface 131_U of the die 131. The connecting pad 139 may have a step formed by the first top surface 139_U1 and the second top surface 139_U2. The inner side surface 139_S may interconnect the first top surface 139_U1 and the second top surface 139_U2. The connecting pad 139 may include a recess 139_RC defined by the first top surface 139_U1 and the inner side surface 139_S.

The lower redistribution patterns CP may include a filled redistribution pattern and a conformal redistribution pattern. Each of the filled redistribution pattern and the conformal redistribution pattern may include a via extending through a lower insulating layer, and a conductive pattern on the via. The filled redistribution pattern may be formed by a fill plating process, and may completely fill an opening of the lower insulating layer, through which the via of the filled redistribution pattern extends. The via of the filled redistribution pattern may have a pillar shape. For example, the via of the filled redistribution pattern may have a tapered pillar shape. The conformal redistribution pattern may be formed by a conformal plating process, and may be formed in a uniform thickness along a side wall of the opening of the lower insulating layer, through which the via of the conformal redistribution pattern extends. The conformal redistribution pattern may include a recess.

The first lower redistribution pattern 153 may be a filled redistribution pattern formed by a fill plating process. The first lower redistribution pattern 153 may be referred to as a "first filled redistribution pattern". The first lower redistribution pattern 153 may contact the first top surface 139_U1 of the connecting pad 139 while being spaced apart from the second top surface 139_U2 and the inner side surface 139_S of the connecting pad 139. The first lower pattern 153 may include a first via 153a and a first conductive pattern 153b. The first via 153a may be disposed on the connecting pad 139. A portion of the first via 153a may be disposed in the recess 139_RC of the connecting pad 139. The first via 153a may extend through the first lower insulating layer 151a. A bottom surface of the first via 153a may contact the first top surface 139_U1 of the connecting pad 139. The width of the bottom surface of the first via 153a may be smaller than the width of the first top surface 139_U1 of the connecting pad 139. A side surface 153a_S of the first via 153a may be spaced apart from the inner side surface 139_S of the connecting pad 139. A portion of the first lower insulating layer 151a may be interposed between the side surface 153a_S of the first via 153a and the inner side surface 139_S of the connecting pad 139. The first lower insulating layer 151a may completely surround the side surface 153a_S of the first via 153a. The first lower insulating layer 151a may contact a portion of the first top surface 139_U1 of the connecting pad 139, and may contact the inner side surface 139_S of the connecting pad 139. The first lower insulating layer 151a may fill the recess 139_RC of the connecting pad 139.

The first conductive pattern 153b may be disposed on the first via 153a. The first conductive pattern 153b may completely cover a top surface of the first via 153a. The width of the first conductive pattern 153b may be greater than the width of the top surface of the first via 153a. A portion of the first conductive pattern 153b may not vertically overlap with the first via 153a. A portion of the first conductive pattern 153b may vertically overlap with a portion of the second top surface 139_U2 of the connecting pad 139. A minimum distance H1 between a bottom surface 153b_B of the first conductive pattern 153b and the second top surface 139_U2 of the connecting pad 139 may be about 3 to 10 μm.

The second lower redistribution pattern 155 may be a filled redistribution pattern formed by a fill plating process. The second lower redistribution pattern 155 may be referred to as a "second filled redistribution pattern". The second lower redistribution pattern 155 may include a second via 155a and a second conductive pattern 155b. The second via 155a may be disposed on the first conductive pattern 153b. The second via 155a may extend through the second lower insulating layer 151b. A bottom surface of the second via 155a may contact a top surface of the first conductive pattern 153b. The second conductive pattern 155b may be disposed on the second via 155a. The second conductive pattern 155b may completely cover a top surface of the second via 155a. A minimum distance H2 between a bottom surface 155b_B of the second conductive pattern 155b and the top surface of the first conductive pattern 153b may be equal to or greater than the minimum distance H1 between a bottom surface 153_B of the first conductive pattern 153b and the second top surface 139_U2 of the connecting pad 139.

The third lower redistribution pattern 157 may be a conformal redistribution pattern formed by a conformal plating process. The third lower redistribution pattern 157 may be referred to as a "conformal redistribution pattern" or a "first conformal redistribution pattern". The third lower redistribution pattern 157 may have a uniform thickness. The third lower redistribution pattern 157 may include a third via 157a and a third conductive pattern 157b. The third via 157a may extend through the third lower insulating layer 151c. The third via 157a may have a U shape. The third via 157a may include a recess 157_RC, and may include a top surface 157a_U and an inner side surface 157a_S which define the recess 157_RC. The top surface 157a_U of the third via 157a may be disposed at a lower level than a top surface of the third lower insulating layer 151c with reference to the top surface 131_U of the die 131 of the semiconductor chip 130. The inner side surface 157a_S of the third via 157a may interconnect the top surface 157a_U of the third via 157a and the third conductive pattern 157b. The third conductive pattern 157b may be connected to an upper end of the third via 157a. The third conductive pattern 157b may extend in the second direction D2, and an extension portion of the third conductive pattern 157b may not overlap with the connecting pad 139. The fourth lower insulating layer 151d may cover the top surface 157a_U and the inner side surface 139_S of the third via 157a. The fourth lower insulating layer 151d may fill the recess 157_RC of the third via 157a. The fourth lower insulating layer 151d may cover the third conductive pattern 157b.

The UBM 159 may be connected to the third conductive pattern 157b while extending through the fourth lower insulating layer 151d. The UBM 159 may be disposed on the portion of the third conductive pattern 157b extending in the second direction D2. The UBM 159 may not vertically overlap with the connecting pad 139. The UBM 159 may not vertically overlap with the first lower redistribution pattern 153, the second lower redistribution pattern 155, and the third via 157a of the third lower redistribution pattern 157.

Although the lower redistribution patterns CP are shown in FIG. 2 as including two filled redistribution patterns 153 and 155, the example embodiments of the disclosure are not limited thereto, and the lower redistribution patterns CP may include three or more filled redistribution patterns under the conformal redistribution pattern 157. In an example embodiment, the lower redistribution patterns CP may further include a fourth lower redistribution pattern, which is a filled redistribution pattern, on the third lower redistribution pattern 157.

Figure 3:
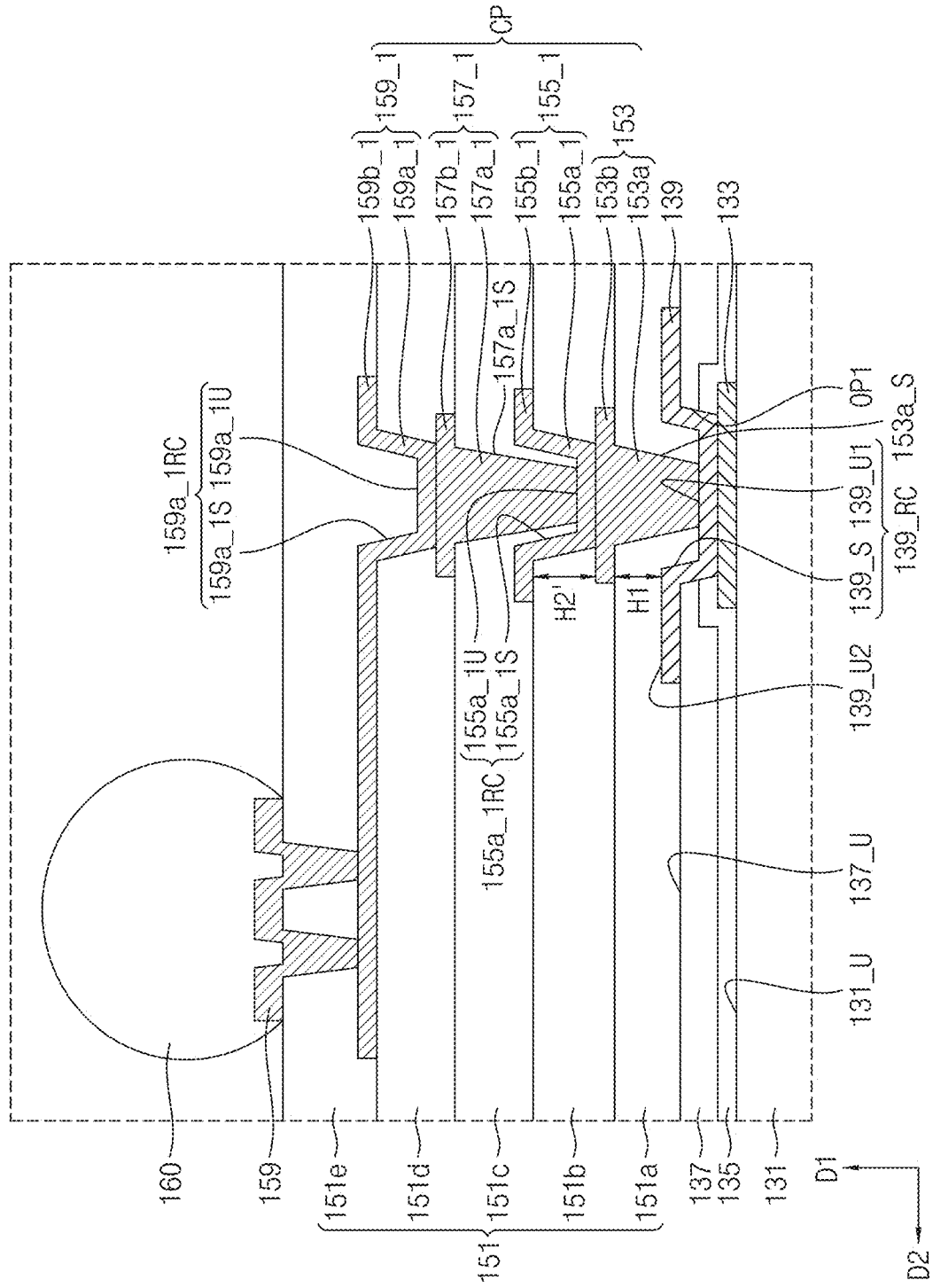
FIG. 3 is an enlarged view showing a portion of a semiconductor package according to an example embodiment of the disclosure.

FIG. 3 is an enlarged view showing a portion of a semiconductor package according to an example embodiment of the disclosure.

Referring to FIG. 3, lower redistribution patterns CP may include a first lower redistribution pattern 153, a second lower redistribution pattern 155_1, a third lower redistribution pattern 157_1, and a fourth lower redistribution pattern 159_1. Lower insulating layers 151 may include a first lower insulating layer 151a, a second lower insulating layer 151b, a third lower insulating layer 151c, a fourth lower insulating layer 151d, and a fifth lower insulating layer 151e. The first lower redistribution pattern 153 may be a filled redistribution pattern, and may have the same characteristics as the first lower redistribution pattern 153 described with reference to FIG. 2.

The second lower redistribution pattern 155_1 may be disposed on the first lower redistribution pattern 153. The second lower redistribution pattern 155_1 may be a conformal redistribution pattern formed by a conformal plating process. The second lower redistribution pattern 155_1 may be referred to as a "first conformal redistribution pattern". The second lower redistribution pattern 155_1 may have a uniform thickness. The second lower redistribution pattern 155_1 may include a second via 155a_1 and a second conductive pattern 155b_1. The second via 155a_1 may extend through the second lower insulating layer 151b. The second via 155a_1 may have a U shape. The second via 155a_1 may include a recess 155a_1RC, and may include a top surface 155a_1U and an inner side surface 155a_1S which define the recess 155a_1RC. The top surface 155a_1U of the second via 155a_1 may be disposed at a lower level than a top surface of the second lower insulating layer 151b with reference to a top surface 131_U of a die 131 of a semiconductor chip 130. The inner side surface 155a_1S of the second via 155a_1 may interconnect the top surface 155a_1U of the second via 155a_1 and the second conductive via 155b_1. The second conductive pattern 155b_1 may be connected to an upper end of the second via 155a_1. The third lower insulating layer 151c may contact a portion of the top surface 155a_1U of the second via 155a_1 and the inner side surface 155a_1S of the second via 155a_1. The third lower insulating layer 151c may fill the recess 155a_1RC of the second via 155a_1. The third lower insulating layer 151c may cover the second conductive pattern 155b_1.

The third lower redistribution pattern 157_1 may be disposed on the second lower redistribution pattern 155_1. The third lower redistribution pattern 157_1 may be a filled redistribution pattern formed by a fill plating process. The third lower redistribution pattern 157_1 may be referred to as a "second filled redistribution pattern". A side surface of the third lower redistribution pattern 157_1 may be spaced apart from the inner side surface 155a_1S of the second lower redistribution pattern 155_1. The third lower insulating layer 151c may be interposed between the side surface of the third lower redistribution pattern 157_1 and the inner side surface 155_1S of the second lower redistribution pattern 155_1. The third lower redistribution pattern 157_1 may include a third via 157a_1 and a third conductive pattern 157b_1. The third via 157a_1 may extend through the third lower insulating layer 151c. A portion of the third via 157a_1 may be disposed in the recess 155a_1RC of the second via 155a_1. A side surface 157a_1S of the third via 157a_1 may be spaced apart from the inner side surface 155a_1S of the second via 155a_1. A portion of the top surface 155a_1U of the second via 155a_1 may be exposed by the third via 157a_1. The third insulating layer 151c may fill the recess 155a_1RC of the second via 155a_1. The third lower insulating layer 151c may contact the inner side surface 155a_1S of the second via 155a_1. The third lower insulating layer 151c may contact a portion of the top surface 155a_1U of the second via 155a_1 exposed by the third via 157a_1. The third lower insulating layer 151c may completely surround the side surface 157a_1S of the third via 157a_1. The third lower insulating layer 151c may be disposed between the side surface 157a_1S of the third via 157a_1 and the inner side surface 155a_1S of the second via 155a_1. The third conductive pattern 157b_1 may be disposed on the third via 157a_1.

The fourth lower redistribution pattern 159_1 may be disposed on the third lower redistribution pattern 157_1. The fourth lower redistribution pattern 159_1 may be a conformal redistribution pattern formed by a conformal plating process. The fourth lower redistribution pattern 159_1 may be referred to as a "second conformal redistribution pattern". The fourth lower redistribution pattern 159_1 may include a fourth via 159a_1 and a fourth conductive pattern 159b_1. The fourth via 159a_1 may extend through the fourth lower insulating layer 151d. The fourth via 159a_1 may have a U shape. The fourth via 159a_1 may include a recess 159a_1RC, and may include a top surface 159a_1U and an inner side surface 159a_1S which define the recess 159a_1RC. The top surface 159a_1U of the fourth via 159a_1 may be disposed at a lower level than a top surface of the fourth lower insulating layer 151d with reference to the top surface 131_U of the die 131 of the semiconductor chip 130. The inner side surface 159a_1S of the fourth via 159a_1 may interconnect the top surface 159a_1U of the fourth via 159a_1 and the fourth conductive pattern 159b_1. The fourth conductive pattern 159b_1 may be connected to an upper end of the fourth via 159a_1. The fifth insulating layer 151e may be disposed on the fourth lower redistribution pattern 159_1. The fifth lower insulating layer 151e may contact the top surface 159a_1U and the inner side surface 159a_1S of the fourth via 159a_1. The fifth lower insulating layer 151e may fill the recess 159a_1RC of the fourth via 159a_1. A UBM 159 may be connected to the fourth lower redistribution pattern 159_1 while extending through the fifth lower insulating layer 151e.

In an example embodiment, the fourth lower redistribution pattern 159_1 may be a filled redistribution pattern formed by a fill plating process, differently from the shown case. In an example embodiment, the fourth lower redistribution pattern 159_1 may be omitted, differently from the shown case. In this case, the third conductive pattern 157b_1 may be directly connected to the UBM 159.

Figure 4:
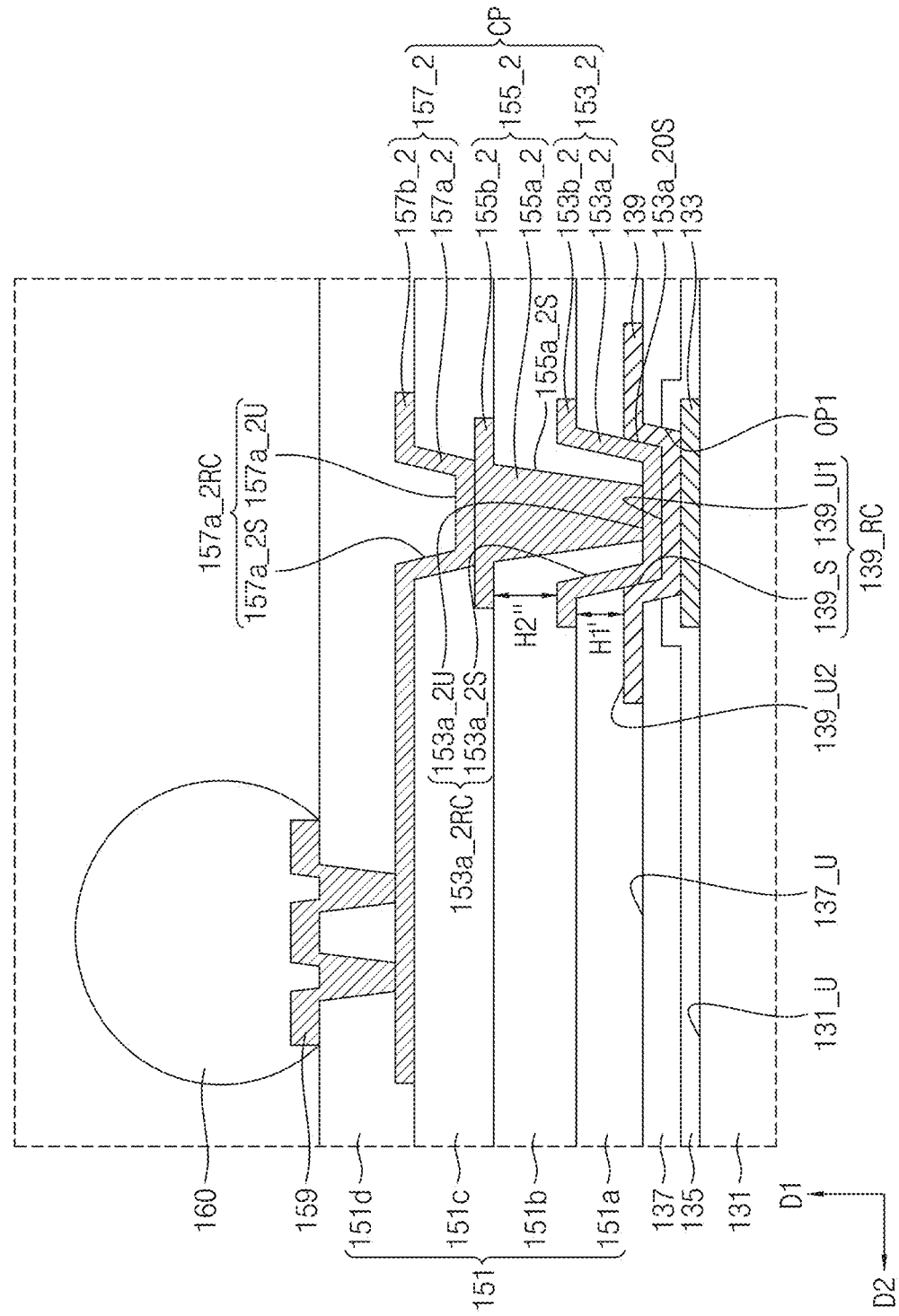
FIG. 4 is an enlarged view showing a portion of a semiconductor package according to an example embodiment of the disclosure.

FIG. 4 is an enlarged view showing a portion of a semiconductor package according to an example embodiment of the disclosure.

Referring to FIG. 4, lower redistribution patterns CP may include a first lower redistribution pattern 153_2, a second lower redistribution pattern 155_2, and a third lower redistribution pattern 157_2. Lower insulating layers 151 may include a first lower insulating layer 151a, a second lower insulating layer 151b, a third lower insulating layer 151c, and a fourth lower insulating layer 151d.

The first lower redistribution pattern 153_2 may be a conformal redistribution pattern formed by a conformal plating process. The first lower redistribution pattern 153_2 may be referred to as a "first conformal redistribution pattern". The first lower redistribution pattern 153_2 may have a uniform thickness. The first lower redistribution pattern 153_2 may include a first via 153a_2 and a first conductive pattern 153b_2. The first via 153a_2 may extend through the first lower insulating layer 151a. The first via 153a_2 may have a U shape. A bottom surface of the first via 153a_2 may cover a first top surface 139_U1 of a connecting pad 139. The width of the bottom surface of the first via 153a_2 may correspond to the width of a first top surface 139_U1 of the connecting pad 139. A portion of an outer side surface 153a_2OS of the first via 153a_2 may contact an inner side surface 139_S of the connecting pad 139. A portion of the outer side surface 153a_2OS of the first via 153a_2 may contact the first lower insulating layer 151a. The first via 153a_2 may include a recess 153a_2RC, and may include a top surface 153a_2U and an inner side surface 153a_2S which define the recess 153a_2RC. The top surface 153a_2U of the first via 153a_2 may be disposed at a lower level than a second top surface 139_U2 of the connecting pad 139 with reference to a top surface 131_U of a die 131 of a semiconductor chip 130. The inner side surface 153a_2S of the first via 153a_2 may interconnect the top surface 153a_2U of the first via 153a_2 and the first conductive pattern 153b_2. The first conductive pattern 153b_2 may be connected to an upper end of the first via 153a_2. The second lower insulating layer 151b may contact a portion of the top surface 153a_2U of the first via 153a_2 and the inner side surface 153a_2S of the first via 153a_2. The second lower insulating layer 151b may fill the recess 153a_2RC of the first via 153a_2. The second lower insulating layer 151b may cover the first conductive pattern 153b_2.

The second lower redistribution pattern 155_2 may be disposed on the first lower redistribution pattern 153_2. The second lower redistribution pattern 155_2 may be a filled redistribution pattern formed by a fill plating process. The second lower redistribution pattern 155_2 may be referred to as a "first filled redistribution pattern". A side surface of the second lower redistribution pattern 155_2 may be spaced apart from the inner side surface 153a_2S of the first lower redistribution pattern 153_2. The second lower insulating layer 151b may be interposed between the side surface of the second lower redistribution pattern 155_2 and the inner side surface 153a_2S of the first lower redistribution pattern 153_2. The second lower redistribution pattern 155_2 may include a second via 155a_2 and a second conductive pattern 155b_2. The second via 155a_2 may extend through the second lower insulating layer 151b. A portion of the second via 155a_2 may be disposed in the recess 153a_2RC of the first via 153a_2. A side surface 155a_2S of the second via 155a_2 may be spaced apart from the inner side surface 153a_2S of the first via 153a_2. A bottom surface of the second via 155a_2 may contact a portion of the top surface 153a_2U of the first via 153a_2. A portion of the top surface 153a_2U of the first via 153a_2 may be exposed by the second via 155a_2. The second lower insulating layer 151b may fill the recess 153a_2RC of the first via 153a_2. The second lower insulating layer 151b may contact the inner side surface 153a_2S of the first via 153a_2. The second lower insulating layer 151b may contact a portion of the top surface 153a_2U of the first via 153a_2 exposed by the second via 155a_2. The second lower insulating layer 151b may completely surround the side surface 155a_2S of the second via 155a_2. The second lower insulating layer 151b may be interposed between the side surface 155a_2S of the second via 155a_2 and the inner side surface 153a_2S of the first via 153a_2. The second conductive pattern 155b_2 may be disposed on the second via 155a_2. A portion of the second conductive pattern 155b_2 may vertically overlap with a portion of the first conductive pattern 153b_2. A minimum distance H2" between the first conductive pattern 153b_2 and the second conductive pattern 155b_2 may be equal to or greater than a minimum distance H1' between the second top surface 139_U2 of the connecting pad 139 and the first conductive pattern 153b_2. For example, the minimum distance H1' between the second top surface 139_U2 of the connecting pad 139 and the first conductive pattern 153b_2 may be about 3 to 10 μm.

The third lower redistribution pattern 157_2 may be disposed on the second lower redistribution pattern 155_2. The third lower redistribution pattern 157_2 may be a conformal redistribution pattern formed by a conformal plating process. The third lower redistribution pattern 157_2 may be referred to as a "second conformal redistribution pattern". The third lower redistribution pattern 157_2 may have a uniform thickness. The third lower redistribution pattern 157_2 may include a third via 157a_2 and a third conductive pattern 157b_2. The third via 157a_2 may extend through the third lower insulating layer 151c. The third via 157a_2 may have a U shape. The third via 157a_2 may include a recess 157a_2RC, and may include a top surface 157a_2U and an inner side surface 157a_2S which define the recess 157a_2RC. The top surface 157a_2U of the third via 157a_2 may be disposed at a lower level than a top surface of the third lower insulating layer 151c with reference to the top surface 131_U of the die 131 of the semiconductor chip 130. The inner side surface 157a_2S of the third via 157a_2 may interconnect the top surface 157a_2U of the third via 157a_2 and the third conductive via 157b_2. The third conductive pattern 157b_2 may be connected to an upper end of the third via 157a_2. The fourth lower insulating layer 151d may be disposed on the third lower redistribution pattern 157_2. The fourth lower insulating layer 151d may fill the recess 157a_2RC of the third via 157a_2. The fourth lower insulating layer 151d may contact the top surface 157a_2U and the inner side surface 157a_2S of the third via 157a_2. The fourth lower insulating layer 151d may cover the second conductive pattern 157b_2.

Figure 5:
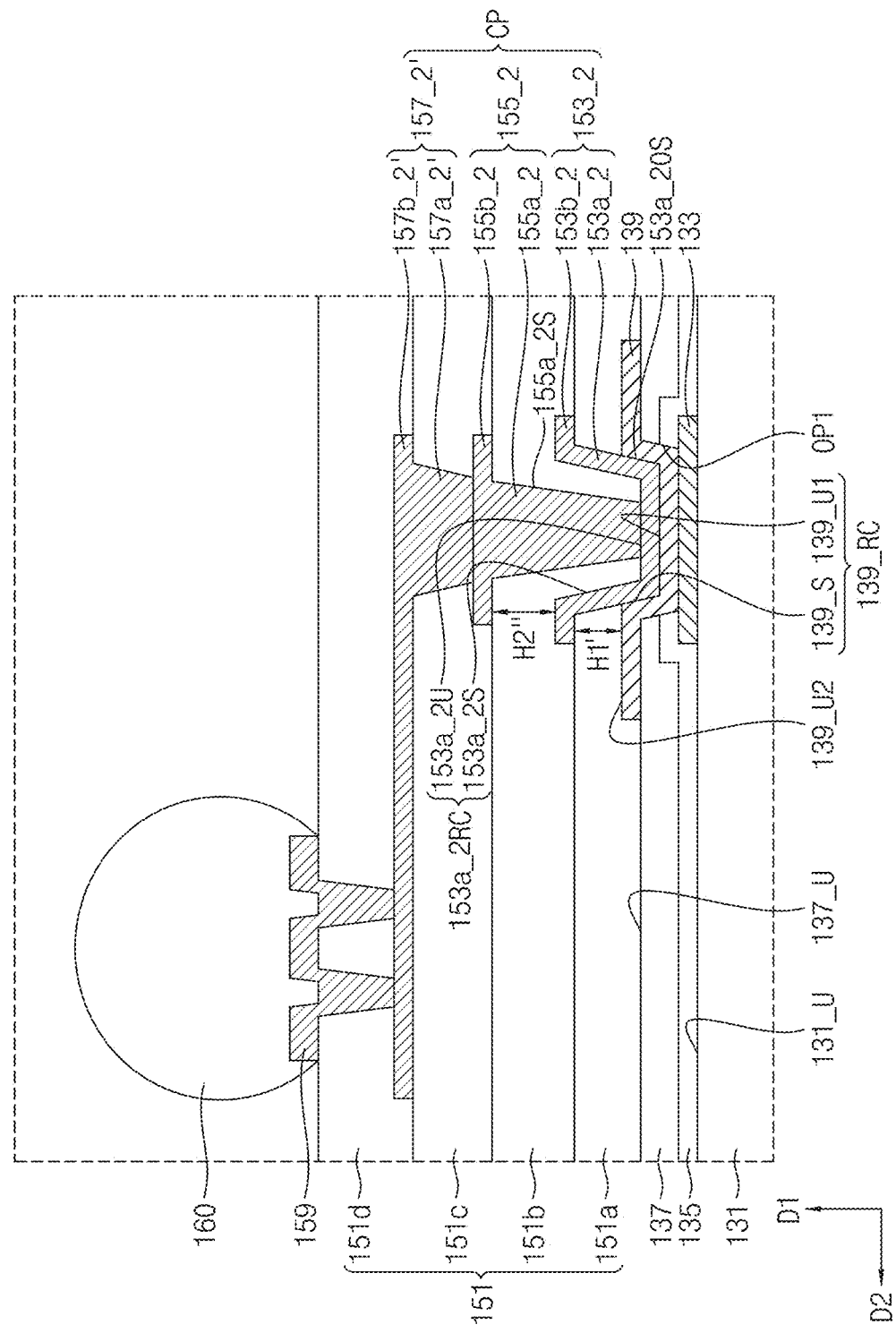
FIG. 5 is an enlarged view showing a portion of a semiconductor package according to an example embodiment of the disclosure.

FIG. 5 is an enlarged view showing a portion of a semiconductor package according to an example embodiment of the disclosure.

Referring to FIG. 5, lower redistribution patterns CP are different from the lower redistribution patterns CP of FIG. 4 in that a third lower redistribution pattern 157_2' is a filled redistribution pattern other than a conformal redistribution pattern. The lower redistribution patterns CP of FIG. 5 may have the same characteristics as the lower redistribution patterns CP described with reference to FIG. 4, except that the third lower redistribution pattern 157_2' is a filled redistribution pattern. The third lower redistribution pattern 157_2' may be referred to as a "second filled redistribution pattern".

Figure 6:
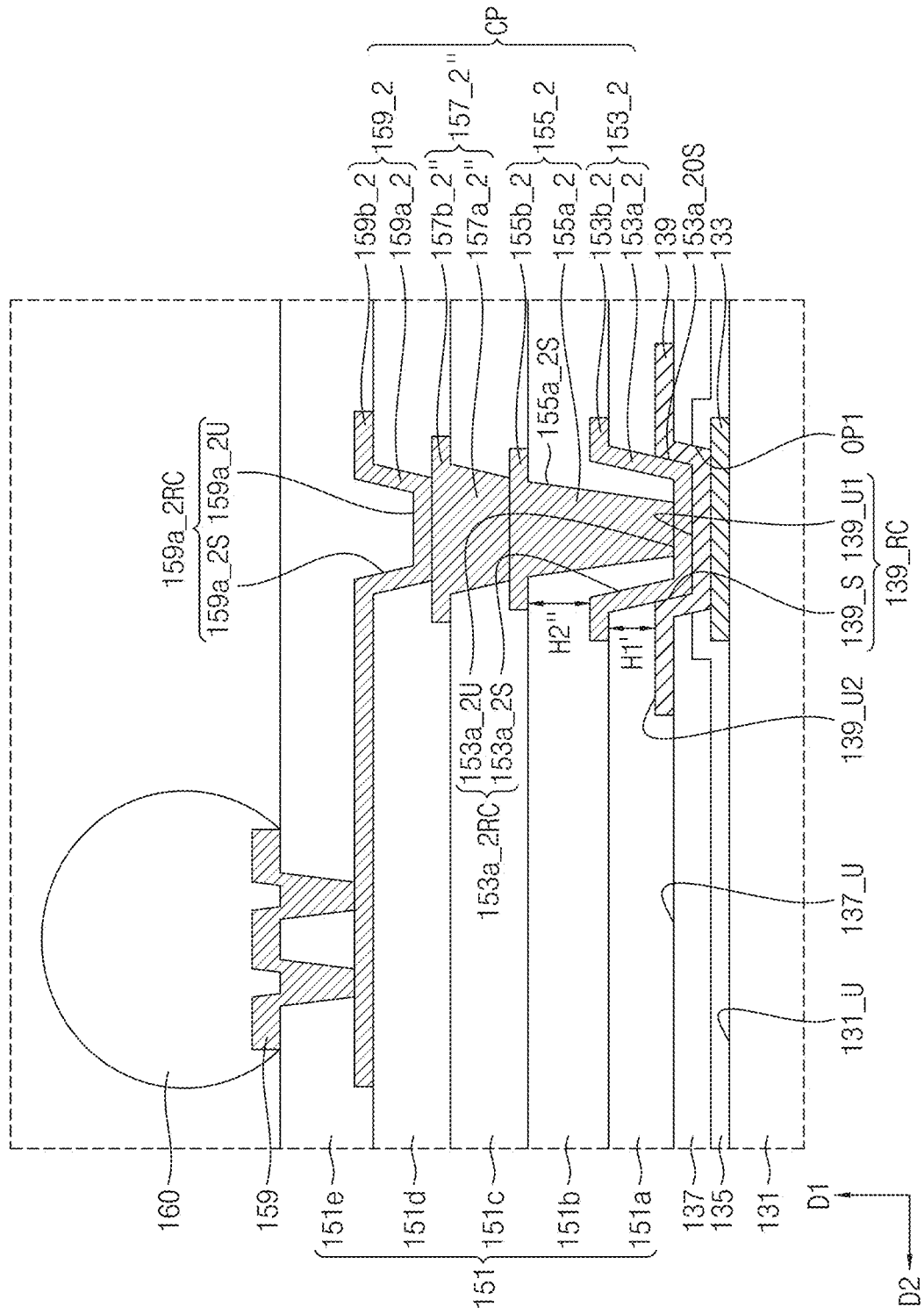
FIG. 6 is an enlarged view showing a portion of a semiconductor package according to an example embodiment of the disclosure.

FIG. 6 is an enlarged view showing a portion of a semiconductor package according to an example embodiment of the disclosure.

Referring to FIG. 6, lower redistribution patterns CP may further include a fourth lower redistribution pattern 159_2, as compared to the lower redistribution patterns CP of FIG. 5, and lower insulating layers 151 may further include a fifth lower insulating layer 151e, as compared to the lower insulating layers 151 of FIG. 5. A third lower redistribution pattern 157_2" may be spaced apart from a UBM 159. The third lower redistribution pattern 157_2" may include a third via 157a_2" and a third conductive pattern 157b_2", and the third conductive pattern 157b_2" may not lengthily extend in a second direction D2, differently from a third conductive pattern 157a_2' of FIG. 5.

A fourth lower redistribution pattern 159_2 may be disposed on the third lower redistribution pattern 157_2". The fourth lower redistribution pattern 159_2 may be a conformal redistribution pattern formed by a conformal plating process. The fourth lower redistribution pattern 159_2 may be referred to as a "second conformal redistribution pattern". The fourth lower redistribution pattern 159_2 may have a uniform thickness. The fourth lower redistribution pattern 159_2 may include a fourth via 159a_2 and a fourth conductive pattern 159b_2. The fourth via 159a_2 may extend through a fourth lower insulating layer 151d. The fourth via 159a_2 may have a U shape. The fourth via 159a_2 may include a recess 159a_2RC, and may include a top surface 159a_2U and an inner side surface 159a_2S which define the recess 159a_2RC. The top surface 159a_2U of the fourth via 159a_2 may be disposed at a lower level than a top surface of the fourth lower insulating layer 151d with reference to a top surface 131_U of a die 131 of a semiconductor chip 130. The inner side surface 159a_2S of the fourth via 159a_2 may interconnect the top surface 159a_2U of the fourth via 159a_2 and the fourth conductive pattern 159b_2. The fourth conductive pattern 159b_2 may be connected to an upper end of the fourth via 159a_2. The fourth conductive pattern 159b_2 may extend in the second direction D2, and an extension portion of the fourth conductive pattern 159b_2 may not overlap with a connecting pad 139. The fifth lower insulating layer 151e may cover the top surface 159a_2U and the inner side surface 159a_2S of the fourth via 159a_2. The fifth lower insulating layer 151e may fill the recess 159a_2RC of the fourth via 159a_2. The fifth lower insulating layer 151e may cover the fourth conductive pattern 159b_2.

A UBM 159 may be connected to the fourth conductive pattern 159b_2 while extending through the fifth lower insulating layer 151e. The UBM 159 may be disposed on the portion of the fourth conductive pattern 159b_2 extending in the second direction D2.

In an example embodiment, the fourth lower redistribution pattern 159_2 may be a filled-plated pattern formed by a fill plating method, differently from the case shown in FIG. 6. In this case, the fourth lower redistribution pattern 159_2 may be referred to as a "third filled redistribution pattern".

Figure 7:
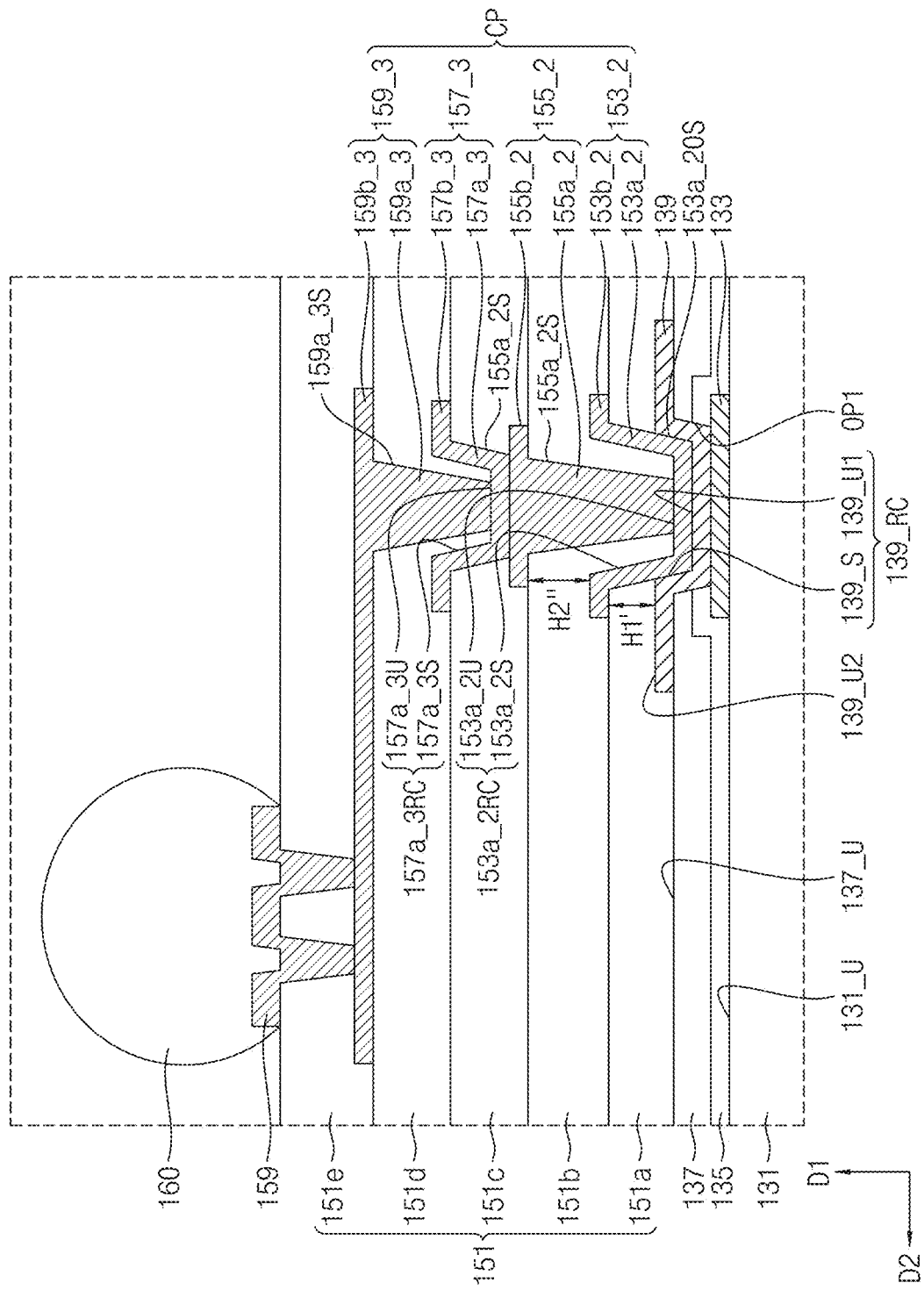
FIG. 7 is an enlarged view showing a portion of a semiconductor package according to an example embodiment of the disclosure.

FIG. 7 is an enlarged view showing a portion of a semiconductor package according to an example embodiment of the disclosure.

Referring to FIG. 7, lower redistribution patterns CP may further include a fourth lower redistribution pattern 159_3, as compared to the lower redistribution patterns CP of FIG. 4, and lower insulating layers 151 may further include a fifth lower insulating layer 151e, as compared to the lower insulating layers 151 of FIG. 4.

A third lower redistribution pattern 157_3 may be disposed on a second lower redistribution pattern 155_2. The third lower redistribution pattern 157_3 may be a conformal redistribution pattern formed by a conformal plating process. The third lower redistribution pattern 157_3 may be referred to as a "second conformal redistribution pattern". The third lower redistribution pattern 157_3 may have a uniform thickness. The third lower redistribution pattern 157_3 may include a third via 157a_3 and a third conductive pattern 157b_3. The third via 157a_3 may extend through a third lower insulating layer 151c. The third via 157a_3 may have a U shape. The third via 157a_3 may include a recess 157a_3RC, and may include a top surface 157a_3U and an inner side surface 157a_3S which define the recess 157a_3RC. The top surface 157a_3U of the third via 157a_3 may be disposed at a lower level than a top surface of the third lower insulating layer 151c with reference to a top surface 131_U of a die 131 of a semiconductor chip 130. The inner side surface 157a_3S of the third via 157a_3 may interconnect the top surface 157a_3U of the third via 157a_3 and the third conductive pattern 157b_3. A fourth lower insulating layer 151d may contact a portion of the top surface 157a_3U of the third via 157a_3 and the inner side surface 157a_3S of the third via 157a_3.

The fourth lower redistribution pattern 159_3 may be disposed on the third lower redistribution pattern 157_3. The fourth lower redistribution pattern 159_3 may be a filled redistribution pattern formed by a fill plating process. The fourth lower redistribution pattern 159_3 may be referred to as a "second filled redistribution pattern". The fourth lower redistribution pattern 159_3 may include a fourth via 159a_3 and a fourth conductive pattern 159b_3. The fourth via 159a_3 may extend through the fourth lower insulating layer 151d, and a portion of the fourth via 159a_3 may be disposed in the recess 157a_3RC of the third via 157a_3. A side surface 159a_3S of the fourth via 159a_3 may be spaced apart from the inner side surface 157a_3S of the third via 157a_3. A portion of the top surface 157a_3U of the third via 157a_3 may be exposed by the fourth via 159a_3. The fourth lower insulating layer 151d may fill the recess 157a_3RC of the third via 157a_3. The fourth lower insulating layer 151d may be interposed between the inner side surface 157a_3S of the third via 157a_3 and the side surface 159a_3S of the fourth via 159a_3. The fourth lower insulating layer 151d may contact the inner side surface 157a_3S of the third via 157a_3. The fourth lower insulating layer 151d may contact a portion of the top surface 157a_3U of the third via 157a_3 exposed by the fourth via 159a_3. The fourth lower insulating layer 151d may completely surround the side surface 159a_3S of the fourth via 159a_3. The fourth conductive pattern 159b_3 may be disposed on the fourth via 159a_3. The fourth conductive pattern 159b_3 may extend in a second direction D2, and an extension portion of the fourth conductive pattern 159b_3 may not vertically overlap with a connecting pad 139. The fifth lower insulating layer 151e may cover the fourth conductive pattern 159b_3 of the fourth lower redistribution pattern 159_3. A UBM 159 may be disposed on the extension portion of the fourth conductive pattern 159b_3 while extending through the fifth lower insulating layer 151e.

Figure 8:
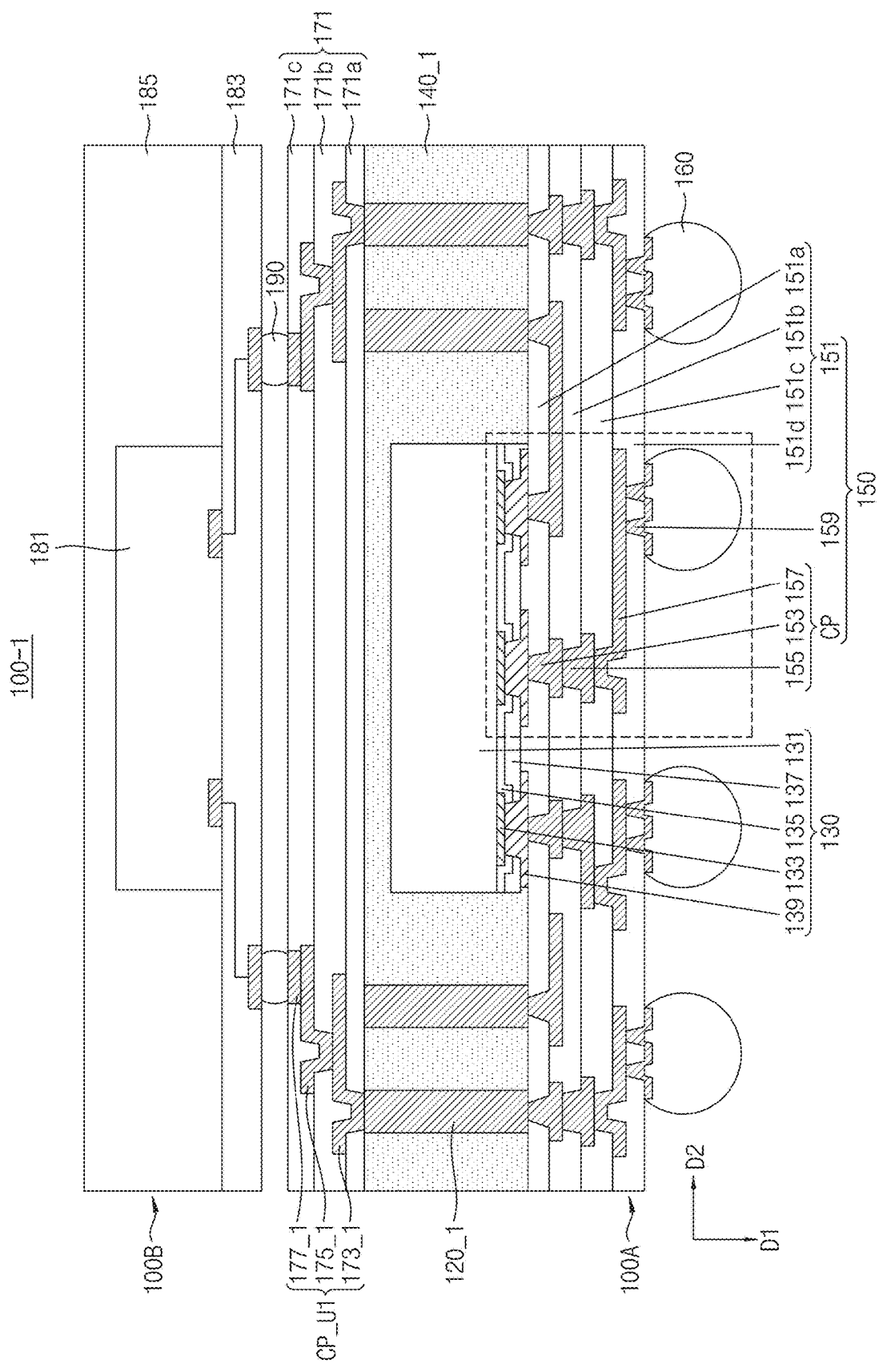
FIG. 8 is a sectional view of a semiconductor package according to an example embodiment of the disclosure.

FIG. 8 is a sectional view of a semiconductor package according to an example embodiment of the disclosure.

Referring to FIG. 8, a semiconductor package 100-1 may include a lower semiconductor package 100A and an upper semiconductor package 100B. The lower semiconductor package 100A may include a semiconductor chip 130, a mold layer 140_1, a conductive connector 120_1, a lower redistribution layer 150, connecting terminals 160, and an upper redistribution layer 171/CP_U1. The lower semiconductor package 100A of FIG. 8 is different form the lower semiconductor package 100A of FIG. 1 in that the lower semiconductor package 100A includes the mold layer 140_1 and the conductive connector 120_1, which extends through the mold layer 140_1, in place of the base layer 110 and the conductive connector 120_1, respectively, in the base layer 110.

The semiconductor chip 130 may be disposed on the lower redistribution layer 150. The mold layer 140_1 may cover a side surface and a top surface of the semiconductor chip 130. The mold layer 140_1 may cover a portion of a top surface of the lower redistribution layer 150. The conductive connector 120_1 may extend through the mold layer 140_1. The conductive connector 120_1 may electrically interconnect the lower redistribution layer 150 and the upper redistribution layer 171/CP_U1.

The semiconductor chip 130 may have the same characteristics as the semiconductor chip 130 described with reference to FIG. 1, except that the semiconductor chip 130 includes a connecting pad 139 having a flat bottom surface. The lower redistribution layer 150 may include lower redistribution patterns CP, lower insulating layers 151, and UBMs 159, and the lower redistribution patterns CP may have characteristics identical or similar to those of the lower redistribution patterns CP described with reference to FIGS.

1 to 7, except that the lower redistribution patterns CP are connected to the connecting pad 139 having the flat bottom surface.

The upper redistribution layer 171/CP_U1 may be disposed on the mold layer 140_1. The upper redistribution layer 171/CP_U1 may include upper insulating layers 171 and upper redistribution patterns CP_U1, and the upper redistribution patterns CP_U1 may include a first upper redistribution pattern 173_1, a second upper redistribution pattern 175_1, and an upper pad 177_1 which are sequentially stacked. The upper insulating layers 171 may include a first upper insulating layer 171a, a second upper insulating layer 171b, and a third upper insulating layer 171c which are sequentially stacked. The first upper redistribution pattern 173_1 may be connected to the conductive connector 120_1 while extending through the first upper insulating layer 171a. The second upper redistribution pattern 175_1 may be connected to the first upper redistribution pattern 173_1 while extending through the second upper insulating layer 171b. The upper pad 177_1 may be disposed on the second upper redistribution pattern 175_1 in the third upper insulating layer 171c.

Figure 9:
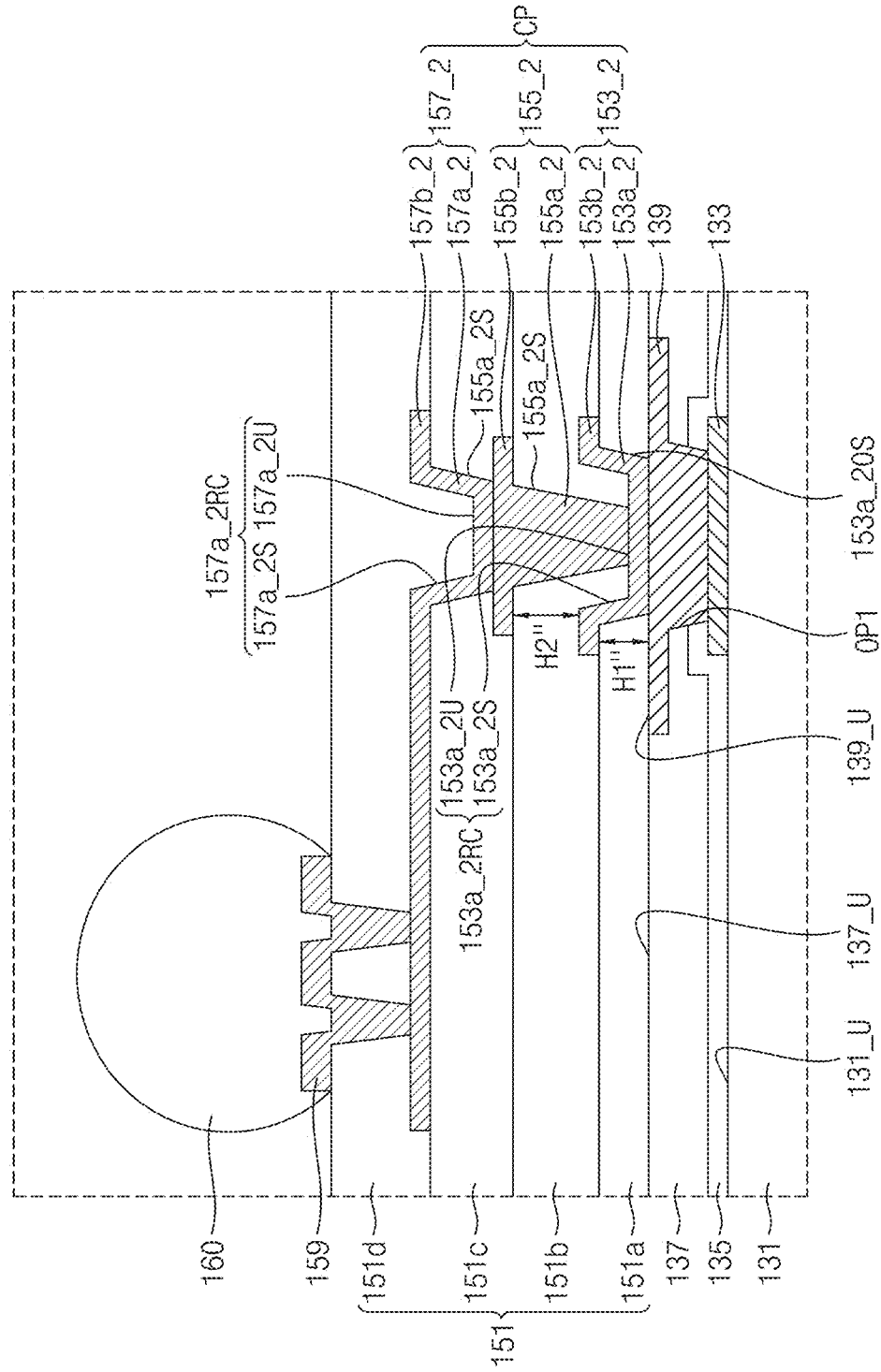
FIG. 9 is an enlarged view showing a portion of a semiconductor package according to an example embodiment of the disclosure.

FIG. 9 is an enlarged view showing a portion of a semiconductor package according to an example embodiment of the disclosure.

Referring to FIG. 9, a connecting pad 139 of a semiconductor chip 130 may include a flat top surface 139_U. For example, the top surface 139_U of the connecting pad 139 may be coplanar with a top surface 137_U of a second passivation layer 137.

Lower redistribution patterns CP may be disposed on the connecting pad 139. The lower redistribution patterns CP may include a first lower redistribution pattern 153_2, a second lower redistribution pattern 155_2, and a third lower redistribution pattern 157_2. The first lower redistribution pattern 153_2 of FIG. 9 may be disposed on the top surface 139_U of the connecting pad 139. The first lower redistribution pattern 153_2 may be a conformal redistribution pattern formed by a conformal plating process. The first lower redistribution pattern 153_2 may include a first via 153a_2 and a first conductive pattern 153b_2. An outer side surface 153a_2OS of the first via 153a_2 may be completely covered by a first lower insulating layer 151a. A minimum distance H1" between the top surface 139_U of the connecting pad 139 and the first conductive pattern 153b_2 may be about 3 to 10 μm. The first lower redistribution pattern 153_2 may have the same characteristics as the first lower redistribution pattern 153_2 described with reference to FIG. 4, except that the first lower redistribution pattern 153_2 is disposed on the flat top surface 139_U of the connecting pad 139, and the outer side surface 153a_2OS of the first via 153a_2 is completely surrounded by the first lower insulating layer 151a. The second lower redistribution pattern 155_2 and the third lower redistribution pattern 157_2 may also have the same characteristics as the second lower redistribution pattern 155_2 and the third lower redistribution pattern 157_2 described with reference to FIG. 4.

Figure 10:
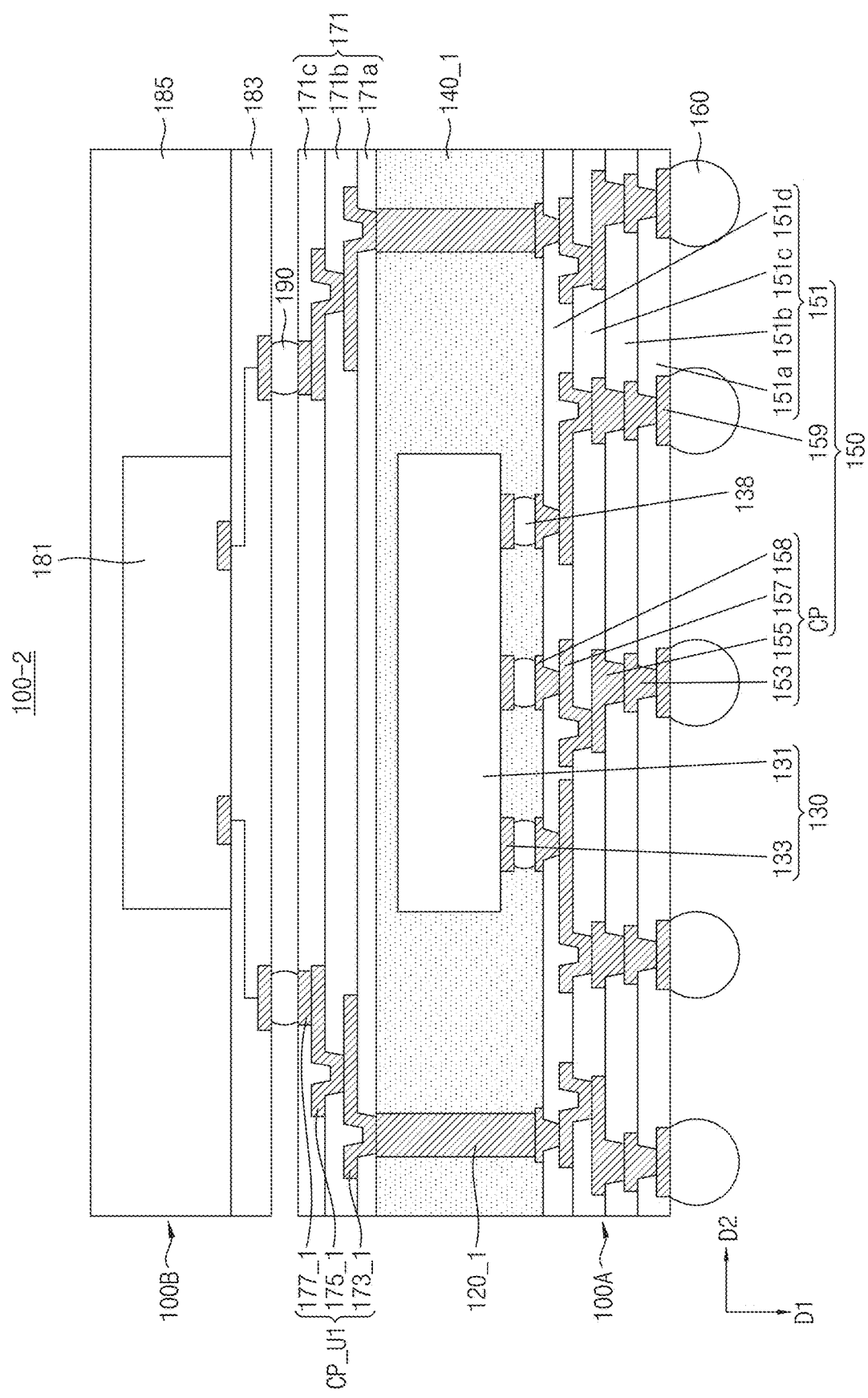
FIG. 10 is a sectional view of a semiconductor package according to an example embodiment of the disclosure.

FIG. 10 is a sectional view of a semiconductor package according to an example embodiment of the disclosure.

Referring to FIG. 10, a semiconductor package 100-2 may include a lower semiconductor package 100A and an upper semiconductor package 100B. The lower semiconductor package 100A may include a semiconductor chip 130, a mold layer 140_1, conductive connectors 120_1, a lower redistribution layer 150, connecting terminals 138 and 160, and an upper redistribution layer 171/CP_U1.

The semiconductor chip 130 may include a die 131 and chip pads 133. The chip pads 133 may be disposed on a bottom surface of the die 131. The mold layer 140_1 may cover the semiconductor chip 130. The mold layer 140_1 may cover a top surface of the lower redistribution layer 150. The conductive connectors 120_1 may extend through the mold layer 140_1, and thus may interconnect the lower redistribution layer 150 and the upper redistribution layer 171/CP_U1.

The lower redistribution layer 150 may be connected to the semiconductor chip 130 via the connecting terminals 138. The connecting terminals 138 may be disposed between the chip pads 133 of the semiconductor chip 130 and the lower redistribution layer 150. The lower redistribution layer 150 may include lower insulating layers 151, lower redistribution patterns CP, and UBMs 159. The lower insulating layers 151 may include a first lower insulating layer 151a, a second lower insulating layer 151b, a third lower insulating layer 151c, and a fourth lower insulating layer 151d. The first to fourth lower insulating layers 151a, 151b, 151c and 151d may be sequentially stacked under the semiconductor chip 130 in a direction opposite to a first direction D1. Accordingly, the fourth lower insulating layer 151d, which is an uppermost layer, may contact the mold layer 140_1. The lower redistribution patterns CP may include a first lower redistribution pattern 153, a second lower redistribution pattern 155, a third lower redistribution pattern 157, and a fourth lower redistribution pattern 158. The first to fourth lower redistribution patterns 153, 155, 157 and 158 may be sequentially stacked in the direction opposite to the first direction D1. A portion of the first lower redistribution pattern 153 may extend through the first lower insulating layer 151a. A portion of the first lower redistribution pattern 153 may be disposed on the first lower insulating layer 151a. A portion of the second redistribution pattern 155 may be connected to the first lower redistribution pattern 153 while extending through the second lower insulating layer 151b. A portion of the second lower redistribution pattern 155 may be disposed on the second lower insulating layer 151b. A portion of the third lower redistribution pattern 157 may be connected to the second lower redistribution pattern 155 while extending through the third lower insulating layer 151c. A portion of the third lower redistribution pattern 157 may be disposed on the third lower insulating layer 151c. A portion of the fourth lower redistribution pattern 158 may be connected to the third lower redistribution pattern 157 while extending through the fourth lower insulating layer 151d. A portion of the fourth lower redistribution pattern 158 may be disposed on the fourth lower insulating layer 151d. The fourth lower redistribution pattern 158 may be connected to the connecting terminal 138, and thus may be electrically connected to the semiconductor chip 130 via the connecting terminal 138. The fourth lower redistribution pattern 158 may contact the mold layer 140_1. The UBMs 159 may be disposed in the first lower insulating layer 151a. The UBMs 159 may be connected to the first lower redistribution pattern 153. The first lower redistribution pattern 153 may be connected to top surfaces of the UBMs 159. Bottom surfaces of the UBMs 159 may be exposed by the first lower insulating layer 151a. Connecting terminals 160 may be disposed on the bottom surfaces of the UBMs 159.

One or two of the first to fourth lower redistribution patterns 153, 155, 157 and 158 may be a conformal redistribution pattern formed by a conformal plating process, and the remaining three or two of the first to fourth lower redistribution patterns 153, 155, 157 and 158 may be a filled redistribution pattern formed by a fill plating process. The lower redistribution patterns CP of FIG. 10 may include the first to third lower redistribution patterns 153, 155 and 157, and may not include the fourth lower redistribution pattern 158. In this case, the lower insulating layers 151 may include the first to third insulating layers 151a, 151b and 151c, and may not include the fourth lower insulating layer 151d. The lower redistribution patterns CP of FIG. 10 may have the characteristics of the lower redistribution patterns CP described with reference to FIGS. 2 to 7. The lower redistribution patterns CP of FIG. 10 may be different from the lower redistribution patterns CP of FIGS. 2 to 7 only in that the first lower redistribution pattern 1532 contacts the UBMs 159 other than the connecting pad 139, the third lower redistribution pattern 157 or the fourth lower redistribution pattern 158 contacts the connecting terminals 138 other than the UBMs 159.

Figure 11:
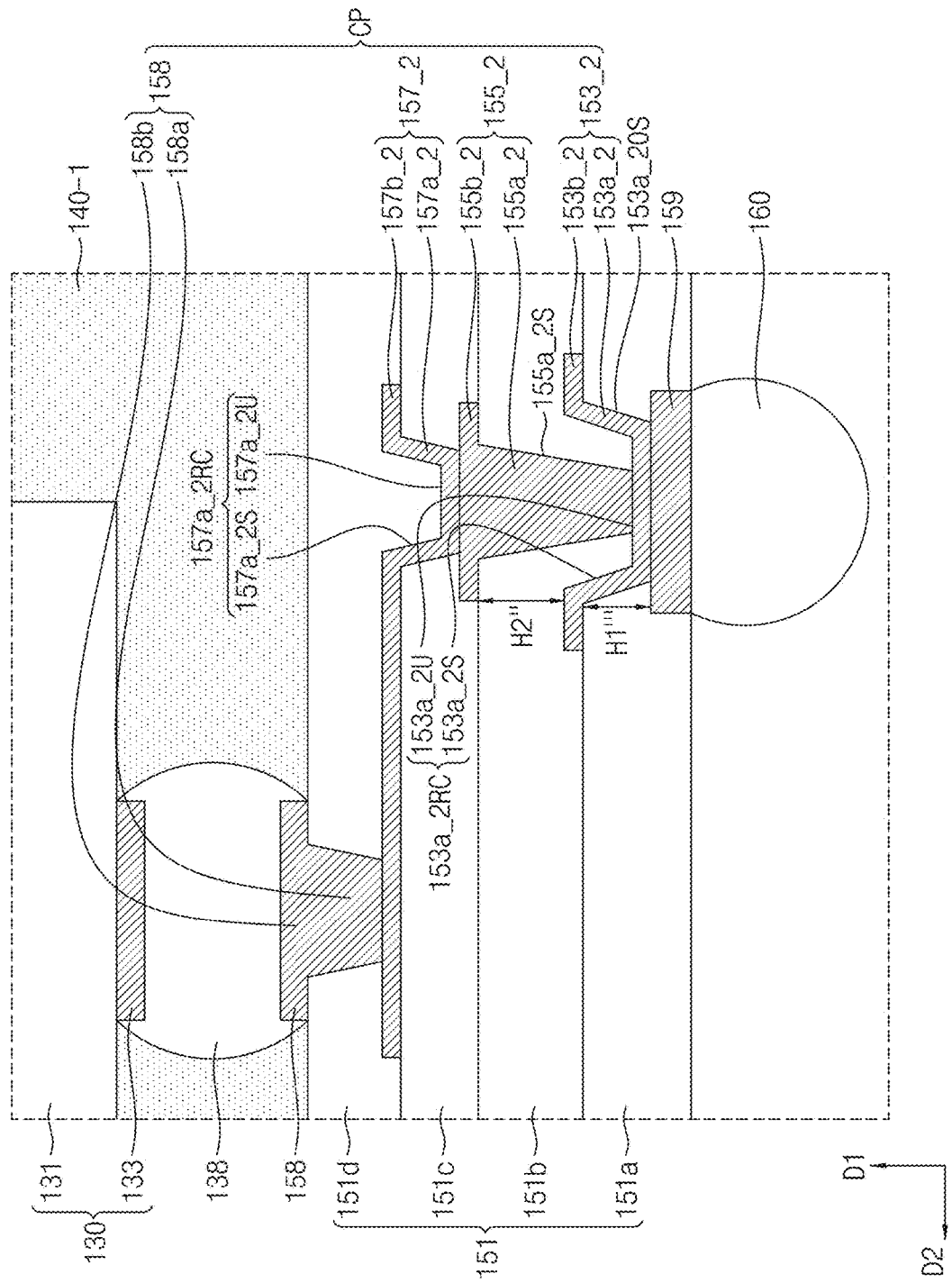
FIG. 11 is an enlarged view of a portion of a semiconductor package according to an example embodiment of the disclosure.

FIG. 11 is an enlarged view of a portion of a semiconductor package according to an example embodiment of the disclosure.

Referring to FIG. 11, a UBM 159 may be disposed in a first lower insulating layer 151a. A bottom surface of the UBM 159 may be coplanar with a bottom surface of the first lower insulating layer 151a. A connecting terminal 160 may be disposed on the bottom surface of the UBM 159.

Lower redistribution patterns CP may include a first lower redistribution pattern 153_2, a second lower redistribution pattern 155_2, a third lower redistribution pattern 157_2, and a fourth lower redistribution pattern 158. The first lower redistribution pattern 153_2 may be disposed on the UBM 159 disposed in the first lower insulating layer 151a. The first lower redistribution pattern 153_2 may be a conformal redistribution pattern formed by a conformal plating process. The first lower redistribution pattern 153_2 may include a first via 153a_2 and a first conductive pattern 153b_2. An outer side surface 153a_2OS of the first via 153a_2 may completely contact the first lower insulating layer 151a. A minimum distance H1''' between the UBM 159 and the first conductive pattern 153b_2 may be about 3 to 10 μm. The first lower redistribution pattern 153_2 may have the same characteristics as the first lower redistribution pattern 153_2 described with reference to FIG. 4, except that the first lower redistribution pattern 153_2 is disposed on the UBM 159 such that the outer side surface 153a_2OS of the first via 153a_2 is completely surrounded by the first lower insulating layer 151a. Further, the second lower redistribution pattern 155_2 and the third lower redistribution pattern 157_2 may have the same characteristics as the second lower redistribution pattern 155_2 and the third lower redistribution pattern 157_2 described with reference to FIG. 4. The fourth lower redistribution pattern 158 may be disposed on the third lower redistribution pattern 157_2, and may be a filled redistribution pattern or a conformal redistribution pattern. The fourth lower redistribution pattern 158 may include a fourth via 158a and a fourth conductive pattern 158b. The fourth via 158a may be connected to the third lower redistribution pattern 157_2 while extending through the fourth lower insulating layer 151d. The fourth conductive pattern 158b may be disposed on the fourth via 158a, and may be connected to the connecting terminal 160.

In accordance with the example embodiments of the disclosure, a redistribution layer having a stack via structure, in which a plurality of vias is vertically stacked, may include a filled redistribution pattern and a conformal redistribution pattern, and thus may alleviate stress caused by a coefficient of thermal expansion difference between a semiconductor chip and the stack via structure. Accordingly, a semiconductor package having enhanced reliability may be provided.

While the above example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. A semiconductor package comprising:
a semiconductor chip comprising a connecting pad;
a mold layer covering the semiconductor chip;
a lower redistribution layer on the semiconductor chip and the mold layer; and
a connecting terminal on the lower redistribution layer,
wherein the lower redistribution layer comprises
a first lower insulating layer,
a first conformal redistribution pattern extending through the first lower insulating layer, the first conformal redistribution pattern including a top horizontal portion, a bottom horizontal portion, and a connecting portion interconnecting the top horizontal portion and the bottom horizontal portion,
a second lower insulating layer on the first lower insulating layer and the first conformal redistribution pattern, and
a first filled redistribution pattern on the first conformal redistribution pattern, the first filled redistribution pattern extending through the second lower insulating layer, the first filled redistribution pattern including a via and a conductive pattern, the via being a filled pattern extending through the second lower insulating layer, an entirety of a top surface of the via being in contact with the conductive pattern, the conductive pattern extending horizontally on the second lower insulating layer,
wherein a side surface of the first filled redistribution pattern is spaced apart from an inner side surface of the connecting portion of the first conformal redistribution pattern, and
wherein the second lower insulating layer is between the inner side surface of the first conformal redistribution pattern and the side surface of the first filled redistribution pattern.

2. The semiconductor package according to claim 1, wherein:
the first conformal redistribution pattern comprises a first via and a first conductive pattern;
the first via comprises a top surface and a side surface that define a recess; and
the second lower insulating layer contacts the top surface of the first via and filling the recess of the first via.

3. The semiconductor package according to claim 2, wherein the second lower insulating layer completely covers the side surface of the first via.

4. The semiconductor package according to claim 2, wherein:
the first filled redistribution pattern comprises a second via and a second conductive pattern; and
a side surface of the second via is spaced apart from the side surface of the first via.

5. The semiconductor package according to claim 4, wherein the second lower insulating layer completely surrounds the side surface of the second via.

6. The semiconductor package according to claim 2, wherein:
the connecting pad comprises a first top surface, a second top surface, and a side surface interconnecting the first top surface and the second top surface; and
the first conformal redistribution pattern completely covers the first top surface and the side surface of the connecting pad.

7. The semiconductor package according to claim 6, wherein a minimum distance between the second top surface of the connecting pad and a bottom surface of the first conductive pattern is about 3 to 10 μm.

8. The semiconductor package according to claim 1, further comprising:
a third lower insulating layer on the second lower insulating layer; and
a second conformal redistribution pattern being on the first filled redistribution pattern and extending through the third lower insulating layer.

9. The semiconductor package according to claim 1, further comprising:
a third lower insulating layer on the second lower insulating layer;
a second filled redistribution pattern being on the first filled redistribution pattern and extending through the third lower insulating layer; and
a second conformal redistribution pattern being on the second filled redistribution pattern.

10. The semiconductor package according to claim 8, further comprising:
a fourth lower insulating layer being on the second conformal redistribution pattern and filling a recess of the second conformal redistribution pattern.

11. The semiconductor package according to claim 10, further comprising:
a second filled redistribution pattern being on the second conformal redistribution pattern and extending through the fourth lower insulating layer.

12. The semiconductor package according to claim 11, wherein:
the second conformal redistribution pattern comprises a first via and a first conductive pattern;
the first via comprises a top surface and a side surface that define a recess; and
the fourth lower insulating layer contacts the top surface of the first via and fills the recess of the first via.

13. The semiconductor package according to claim 12, wherein:
the second filled redistribution pattern comprises a second via and a second conductive pattern; and
a side surface of the second via is spaced apart from the side surface of the first via.

14. The semiconductor package according to claim 13, wherein the fourth lower insulating layer is between the side surface of the first via and the side surface of the second via.

15. The semiconductor package according to claim 13, wherein the fourth lower insulating layer completely surrounds the side surface of the second via.

16. A semiconductor package comprising:
a base layer comprising an opening;
a conductive connector extending through the base layer;
a semiconductor chip in the opening;
a mold layer covering a top surface of each of the base layer and the semiconductor chip; and
a lower redistribution layer on the base layer, the semiconductor chip and the mold layer,
wherein the semiconductor chip comprises a die, a chip pad on the die, and a connecting pad on the chip pad, the connecting pad comprising a first horizontal top surface, a second horizontal top surface, and an inner side surface interconnecting the first horizontal top surface and the second horizontal top surface,
wherein the lower redistribution layer comprises
a first lower insulating layer on the semiconductor chip,
a first lower redistribution pattern extending through the first lower insulating layer, the first lower redistribution pattern comprising a first via and a first conductive pattern, the first via extending through the first lower insulating layer and being in contact with the first horizontal top surface of the connecting pad, and the first conductive pattern being on the first via and extending horizontally on the first lower insulating layer, and
a second lower redistribution pattern on the first lower redistribution pattern,
wherein a side surface of the first via is spaced apart from the inner side surface of the connecting pad, and
wherein the first lower insulating layer is between the side surface of the first via and the inner side surface of the connecting pad.

17. The semiconductor package according to claim 16, wherein the first lower insulating layer contacts a portion of the first horizontal top surface of the connecting pad and the inner side surface of the connecting pad.

18. The semiconductor package according to claim 16, wherein the first lower insulating layer completely surrounds the side surface of the first via.

19. The semiconductor package according to claim 16, wherein the second lower redistribution pattern is a conformal redistribution pattern or a filled redistribution pattern.

20. A semiconductor package comprising:
a semiconductor chip comprising a chip pad;
a mold layer covering the semiconductor chip;
a lower redistribution layer on a bottom surface of the mold layer; and
a conductive connector connected to the lower redistribution layer and extending through the mold layer,
wherein the lower redistribution layer comprises,
an under bump metal (UBM),
a first lower insulating layer covering the UBM,
a first conformal redistribution pattern on the UBM, the first conformal redistribution pattern extending through the first lower insulating layer, the first conformal redistribution pattern including a top horizontal portion, a bottom horizontal portion, and a connecting portion interconnecting the top horizontal portion and the bottom horizontal portion,
a second lower insulating layer on the first conformal redistribution pattern; and
a first filled redistribution pattern on the first conformal redistribution pattern, the first filled redistribution pattern extending through the second lower insulating layer, the first filled redistribution pattern including a via and a conductive pattern, the via being a filled pattern extending through the second lower insulating layer, an entirety of a top surface of the via being in contact with the conductive pattern, the conductive pattern extending horizontally on the second lower insulating layer,
wherein a side surface of the first filled redistribution pattern is spaced apart from an inner side surface of the connecting portion of the first conformal redistribution pattern, and wherein the second lower insulating layer is between the inner side surface of the first conformal redistribution pattern and the side surface of the first filled redistribution pattern.

* * * * *